(12) United States Patent
Sakane

(10) Patent No.: US 9,169,418 B2
(45) Date of Patent: Oct. 27, 2015

(54) THERMOSETTING EPOXY RESIN COMPOSITION AND USES THEREOF

(75) Inventor: Masanori Sakane, Ohtake (JP)

(73) Assignee: DAICEL CORPORATION, Osaka-shi (JP)

( * ) Notice: Subject to any disclaimer, the term of this patent is extended or adjusted under 35 U.S.C. 154(b) by 150 days.

(21) Appl. No.: 13/812,583

(22) PCT Filed: Jul. 20, 2011

(86) PCT No.: PCT/JP2011/066433
§ 371 (c)(1),
(2), (4) Date: Jan. 28, 2013

(87) PCT Pub. No.: WO2012/029425
PCT Pub. Date: Mar. 8, 2012

(65) Prior Publication Data
US 2013/0131216 A1    May 23, 2013

(30) Foreign Application Priority Data

Sep. 3, 2010    (JP) ................................. 2010-197300

(51) Int. Cl.
| | | |
|---|---|---|
| H01L 23/29 | (2006.01) | |
| C08L 63/00 | (2006.01) | |
| C08K 5/51 | (2006.01) | |
| C08K 5/524 | (2006.01) | |
| C08G 59/24 | (2006.01) | |
| C09D 163/00 | (2006.01) | |
| C08G 59/68 | (2006.01) | |

(52) U.S. Cl.
CPC .............. *C09D 163/00* (2013.01); *C08G 59/24* (2013.01); *C08G 59/68* (2013.01); *C08L 63/00* (2013.01); *H01L 23/293* (2013.01); *C08K 5/51* (2013.01)

(58) Field of Classification Search
None
See application file for complete search history.

(56) References Cited

U.S. PATENT DOCUMENTS

| | | | |
|---|---|---|---|
| 5,198,479 A * | 3/1993 | Shiobara et al. ............... | 523/214 |
| 5,985,510 A | 11/1999 | Akutsu et al. | |
| 6,348,523 B1 | 2/2002 | Tachikawa et al. | |
| 6,507,049 B1 * | 1/2003 | Yeager et al. ................. | 257/100 |
| 6,528,595 B1 | 3/2003 | Ikawa et al. | |
| 6,617,400 B2 * | 9/2003 | Yeager et al. ................. | 525/533 |
| 2006/0270828 A1 | 11/2006 | Maeshima | |
| 2011/0114972 A1 * | 5/2011 | Sato et al. ........................ | 257/88 |

FOREIGN PATENT DOCUMENTS

| | | | |
|---|---|---|---|
| JP | 09-071636 A | 3/1997 | |
| JP | 09-255764 A | 9/1997 | |
| JP | 09-278869 A | 10/1997 | |
| JP | 10-156952 A | 6/1998 | |
| JP | 2000-063485 A | 2/2000 | |
| JP | 2004-210932 A | 7/2004 | |
| JP | 2007-169337 A | 7/2007 | |
| JP | 2007-308683 A | 11/2007 | |
| JP | 2009-126974 A | 6/2009 | |
| WO | WO 00/46317 A1 | 8/2000 | |
| WO | WO 2006/064736 A1 | 6/2006 | |
| WO | WO 2010013407 A1 * | 2/2010 | ............. C08G 59/14 |

OTHER PUBLICATIONS

International Search Report for PCT/JP2011/066433 dated Aug. 23, 2011.

* cited by examiner

*Primary Examiner* — Michael J Feely
(74) *Attorney, Agent, or Firm* — Birch, Stewart, Kolasch & Birch, LLP

(57) ABSTRACT

Disclosed is a liquid thermosetting epoxy resin composition including a base resin, a curing agent (D), and curing accelerator (E) or including a base resin and a curing catalyst (D'), each base resin including an alicyclic epoxy compound (A) having at least one alicyclic skeleton and two or more epoxy groups per molecule; a polyester polyol and/or a polycarbonate polyol (B), each polyol having two or more terminal hydroxyl groups; and a phosphorous ester (C). The liquid thermosetting epoxy resin composition exhibits excellent viscosity stability and can give a cured article which is homogeneous even when having a large thickness, does not crack under heat cycle conditions, and is highly thermally stable and satisfactorily optically transparent.

12 Claims, No Drawings

THERMOSETTING EPOXY RESIN COMPOSITION AND USES THEREOF

TECHNICAL FIELD

The present invention relates to epoxy resin compositions, cured resin articles, and optical semiconductor devices. More specifically, the present invention relates to: liquid epoxy resin compositions which can be cured by heating to give cured articles having higher flexural strengths without deterioration in transparency; cured resin articles derived from the liquid epoxy resin compositions; and optical semiconductor devices using the liquid epoxy resin compositions as sealants.

BACKGROUND ART

Epoxy resin compositions for the sealing of optical semiconductor elements often employ liquid epoxy compounds each having an alicyclic skeleton that is satisfactorily transparent and thermally stable. Such epoxy compounds are typified by CELLOXIDE 2021 [3,4-epoxycyclohexylmethyl(3,4-epoxy)cyclohexanecarboxylate], CELLOXIDE 2081 [an adduct of 3,4-epoxycyclohexylmethyl(3,4-epoxy)cyclohexanecarboxylate with ε-caprolactone dimer], and CELLOXIDE 3000 (1,2,8,9-diepoxylimonene) each supplied by Daicel Chemical Industries Ltd.

Alicyclic epoxy compounds having a 3,4-epoxycyclohexylmethyl(3,4-epoxy)cyclohexanecarboxylate structure, represented by CELLOXIDE 2021, can be cured to give cured articles having excellent thermal stability and satisfactory transparency, and are thereby used as resins for sealing or encapsulating optical semiconductors such as LEDs. However, the alicyclic epoxy compounds such as CELLOXIDE 2021, when used alone, may exhibit insufficient heat-cycle endurance to suffer from cracking, and thereby cause product electronic components to have insufficient reliability.

Exemplary customary proposals to improve properties of epoxy resins typically for improving impact strength or for suppressing the occurrence of cracking are as follows. Japanese Unexamined Patent Application Publication (JP-A) No. H09-255764 discloses an epoxy resin composition which includes a hydrogenated bisphenol-A diglycidyl ether and which is used for sealing an optical semiconductor. JP-A No. H10-156952 discloses a stereolithographic resin composition using an alicyclic epoxy compound. JP-A No. 2000-63485 discloses a curable composition for buildup, containing a specific alicyclic epoxy compound and a polyepoxy compound having a polyhydric phenol (polyphenol) skeleton. JP-A No. H09-71636 describes an active-energy-ray-curable composition using an alicyclic epoxy compound. PCT International Publication Number WO2006/064736 discloses a thermosetting resin composition including a polyol oligomer.

CITATION LIST

Patent Literature

PTL 1: JP-A No. H09-255764
PTL 2: JP-A No. H10-156952
PTL 3: JP-A No. 2000-63485
PTL 4: JP-A No. H09-71636
PTL 5: PCT International Publication Number WO2006/064736

SUMMARY OF INVENTION

Technical Problem

However, the epoxy resin composition for sealing an optical semiconductor disclosed in JP-A No. H09-255764 is disadvantageous typically in coloring, weatherability, and thermal stability. JP-A No. H10-156952 fails to mention the use of the resin composition for sealing an optical semiconductor. The curable composition for buildup described in JP-A No. 2000-63485 is not one featured by thermal stability and transparency. The active-energy-ray-curable composition described in JP-A No. H09-71636 is to be cured with an active energy ray and, when used to give a thick-wall cured article, may undergo partial curing failure (insufficient curing) and thereby fail to give an optically homogeneous cured article. In addition, the resulting cured article, when being a thick film, may disadvantageously suffer from surface waviness and/or insufficient curing in a deep portion with respect to irradiation and in an underexposed portion. The thermosetting resin composition including a polyol oligomer disclosed in PCT International Publication Number WO2006/064736 disadvantageously has insufficient viscosity stability of the base resin and often causes troubles in curing process, although the resin composition is improved in elastic properties.

Under these circumstances, an object of the present invention is to provide a liquid epoxy resin composition which has excellent stability in viscosity and which can give a cured article being homogeneous even when having a large thickness, not suffering from cracking in heat cycles, and having excellent thermal stability and superior transparency (optical transparency). Another object of the present invention is to provide a cured resin article cured from the epoxy resin composition; and an optical semiconductor device including an optical semiconductor element sealed with the epoxy resin composition.

Solution to Problem

The present inventors have found that the heat-cycle resistance can be improved by improving elastic properties of an alicyclic epoxy resin. They have also found that a thermosetting epoxy resin composition for the sealing of an optical semiconductor, when including such alicyclic epoxy resin and a specific polyol as essential constituents, can give a cured article which is optically homogeneous, is free from the occurrence of insufficiently cured portions, and can have heat-cycle resistance while maintaining good transparency and thermal stability. In addition, they have found that the alicyclic epoxy resin, when including a phosphorous ester as a constituent, can exhibit significantly better viscosity stability of the base resin. The present invention has been made based on these findings.

Specifically, the present invention provides, in a first embodiment, a liquid thermosetting epoxy resin composition including a base resin; a curing agent (D); and a curing accelerator (E), in which the base resin including an alicyclic epoxy compound (A) having at least one alicyclic skeleton and two or more epoxy groups per molecule; a polyester polyol and/or a polycarbonate polyol (B), each polyol having two or more terminal hydroxyl groups; and a phosphorous ester (C).

The present invention provides, in a second embodiment, a liquid thermosetting epoxy resin composition including a base resin; and a curing catalyst (D'), in which the base resin includes an alicyclic epoxy compound (A) having at least one alicyclic skeleton and two or more epoxy groups per molecule; a polyester polyol and/or a polycarbonate polyol (B), each polyol having two or more terminal hydroxyl groups; and a phosphorous ester (C).

In a third embodiment, the present invention provides the liquid thermosetting epoxy resin composition of the first embodiment, which includes:

the base resin;
50 to 150 parts by weight of the curing agent (D) per 100 parts by weight of the total amount of the component (A) and the component (B); and
0.05 to 5 parts by weight of the curing accelerator (E) per 100 parts by weight of the total amount of the component (A) and the component (B),
in which the base resin includes:
95 to 50 parts by weight of the alicyclic epoxy compound (A) having at least one alicyclic skeleton and two or more epoxy groups per molecule,
5 to 50 parts by weight of the polyester polyol and/or polycarbonate polyol (B), each polyol having two or more terminal hydroxyl groups, and
0.005 to 5 parts by weight of the phosphorous ester (C), each per 100 parts by weight of the total amount of the component (A) and the component (B).

The present invention provides, in a fourth embodiment, the liquid thermosetting epoxy resin composition of the second embodiment, which includes:
the base resin; and
0.01 to 15 parts by weight of the curing catalyst (D') per 100 parts by weight of the total amount of the component (A) and the component (B),
in which the base resin includes:
95 to 50 parts by weight of the alicyclic epoxy compound (A) having at least one alicyclic skeleton and two or more epoxy groups per molecule;
5 to 50 parts by weight of the polyester polyol and/or polycarbonate polyol (B), each polyol having two or more terminal hydroxyl groups; and
0.005 to 5 parts by weight of the phosphorous ester (C), each per 100 parts by weight of the total amount of the component (A) and the component (B).

The present invention provides, in a fifth embodiment, the liquid thermosetting epoxy resin composition of any one of the first, second, third, and fourth embodiments of the present invention, which is used for sealing an optical semiconductor.

The present invention provides, in a sixth embodiment, a liquid epoxy resin composition including an alicyclic epoxy compound (A) having at least one alicyclic skeleton and two or more epoxy groups per molecule; a polyester polyol and/or a polycarbonate polyol (B), each polyol having two or more terminal hydroxyl groups; and a phosphorous ester (C).

The present invention provides, in a seventh embodiment, the liquid epoxy resin composition of the sixth embodiment, which is used for sealing an optical semiconductor.

The present invention provides, in an eighth embodiment, a cured resin article cured from the epoxy resin composition of any one of the first, second, third, fourth, fifth, sixth, and seventh embodiments.

The present invention provides, in a ninth embodiment, the cured resin article of the eighth embodiment, which is optically homogeneous.

In addition, the present invention provides, in a tenth embodiment, an optical semiconductor device including an optical semiconductor element sealed with the liquid epoxy resin composition for sealing an optical semiconductor of the fifth or seventh embodiment.

Advantageous Effects of Invention

The liquid thermosetting epoxy resin compositions according to the present invention have satisfactory viscosity stability and give, through thermal curing, cured articles which are optically homogeneous, are free from the occurrence of insufficiently cured portions, have a low flexural modulus (bending elastic modulus) and a high flexural strength (bending strength), have a high glass transition temperature and satisfactory transparency, and are advantageous for the sealing of an optical semiconductor. The cured articles are also free from disadvantages in heat-cycle endurance.

DESCRIPTION OF EMBODIMENTS

Liquid Thermosetting Epoxy Resin Compositions

Liquid thermosetting epoxy resin compositions according to embodiments of the present invention are preferably liquid and have a viscosity (25° C.) of preferably 20000 mPa·s or less and more preferably 15000 mPa·s or less, for satisfactory workability upon sealing of an optical semiconductor. As used herein the term "liquid" refers to that the substance in question is liquid at room temperature (25° C.)

The liquid thermosetting epoxy resins according to the present invention each include a base resin, a curing agent (D), and a curing accelerator (E); or include a base resin and a curing catalyst (D'). The base resin for use in the present invention includes an alicyclic epoxy compound (A) having at least one alicyclic skeleton and two or more epoxy groups per molecule; a polyester polyol and/or a polycarbonate polyol (B), each polyol having two or more terminal hydroxyl groups; and a phosphorous ester (phosphite) (C). A liquid epoxy resin composition according to an embodiment of the present invention is a composition including the components (A), (B), and (C).

The components (A), (B), (C), (D), and (E) for use in the present invention will be illustrated below.

[Alicyclic Epoxy Compound (A)]

The alicyclic epoxy compound (A) for use in the liquid thermosetting epoxy resins according to the present invention is not limited, as long as being a compound having at least one alicyclic skeleton and two or more epoxy groups per molecule, but the epoxy groups preferably each include adjacent two carbon atoms constituting the alicyclic skeleton(s). Such alicyclic epoxy compound (A) is typified by the following compounds:

[Chem. 1]

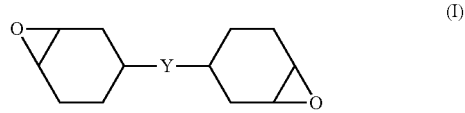

(I)

The alicyclic epoxy compounds represented by General Formula (I) are prepared by oxidizing a corresponding alicyclic olefinic compound typically with an aliphatic peroxycarboxylic acid. Of the alicyclic epoxy compounds, preferred are those prepared by oxidizing a corresponding alicyclic olefinic compound with a substantially anhydrous aliphatic peroxycarboxylic acid for having high epoxidation rate (e.g., JP-A No. 2002-275169).

In General Formula (I), Y represents single bond or a linkage group. The linkage group is typified by divalent hydrocarbon groups, carbonyl group (—CO—), ether bond (—O—), ester bond (—COO—), amide bond (—CONH—), carbonate bond (—OCOO—), and groups each including two or more of them bonded to each other. Preferred examples of the divalent hydrocarbon groups include linear or branched chain alkylene groups having 1 to 18 carbon atoms, of which those having 1 to 6 carbon atoms are more preferred; and divalent alicyclic hydrocarbon groups, of which divalent cycloalkylene groups are more preferred. The linear or branched chain alkylene groups are exemplified by methylene, methylmethylene, dimethylmethylene, ethylene, propylene, and trimethylene groups. The divalent alicyclic hydrocarbon groups are exemplified by 1,2-cyclopentylene, 1,3-cyclopentylene, cyclopentylidene, 1,2-cyclohexylene, 1,3-cyclohexylene, 1,4-cyclohexylene, and cyclohexylidene groups.

Specific examples of the aforementioned compounds include the following compounds:

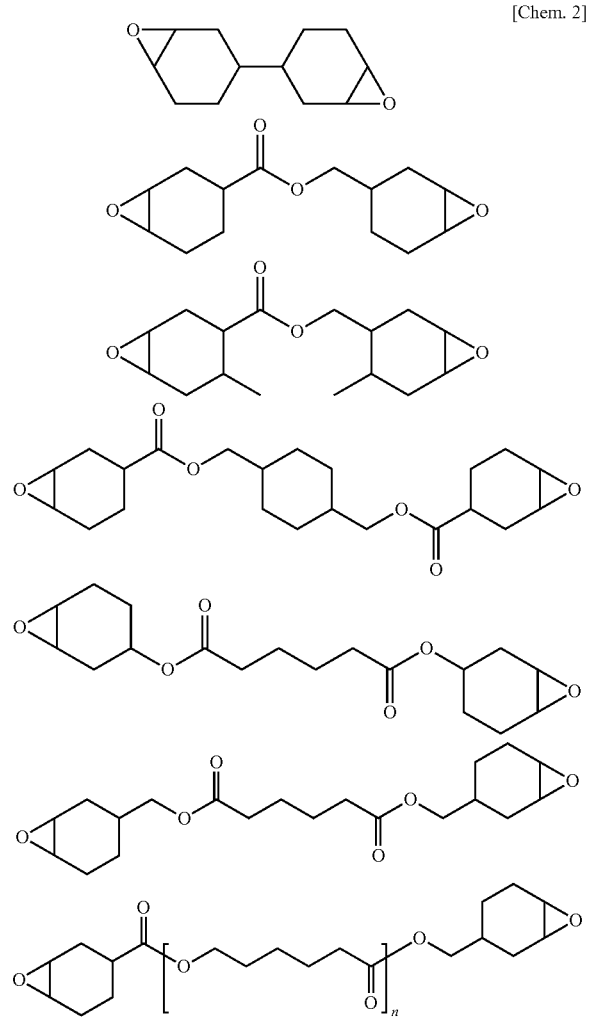

[Chem. 2]

The repetition number n denotes an integer of 1 to 30.

Exemplary alicyclic epoxy compounds usable as the component (A) herein further include, in addition to the aforementioned compounds, epoxy compounds having two epoxy groups, only one of which includes adjacent two carbon atoms constituting an alicyclic skeleton (e.g., limonene diepoxide); and glycidyl ether compounds having epoxy groups each not including a carbon atom constituting an alicyclic skeleton (e.g., glycidyl ether type epoxy compounds each having an alicyclic skeleton and glycidyl ether groups). Examples of these compounds include the following compounds:

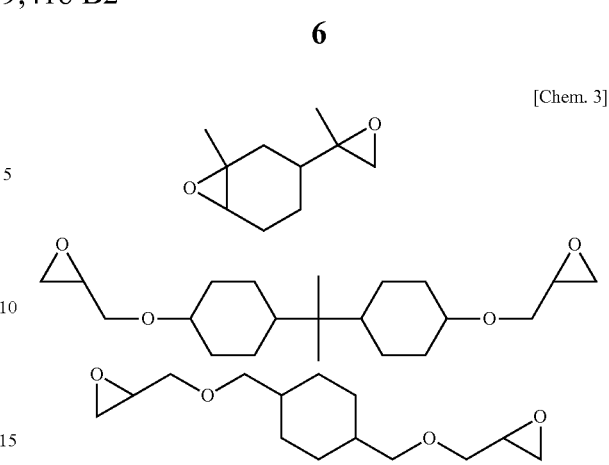

[Chem. 3]

Exemplary alicyclic epoxy compounds usable herein further include multifunctional epoxy compounds each having three or more epoxy groups, which are typified by the following compounds:

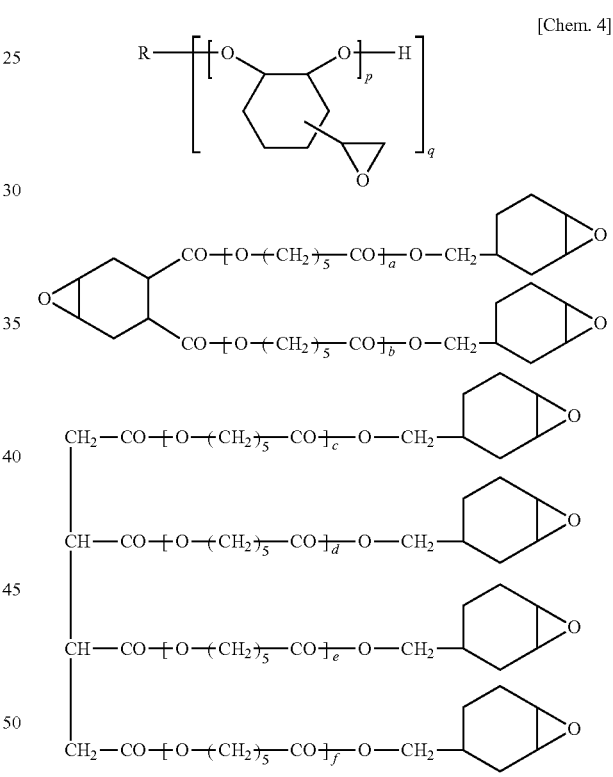

[Chem. 4]

In the formulae, each of the repetition numbers a, b, c, d, e, and f independently denotes an integer of 0 to 30; R represents a group corresponding to a q-valent (q-hydric) alcohol [R—(OH)q], except for removing —OH(s) in a number of q therefrom; p denotes an integer of 1 to 50; and q denotes an integer of 1 to 10. The numbers p in groups indicated in the parentheses in a number of q may be the same as or different from each other. The q-hydric alcohol [R—(OH)q] is typified by monohydric alcohols such as methanol, ethanol, 1-propanol, isopropyl alcohol, and 1-butanol; dihydric alcohols such as ethylene glycol, 1,2-propanediol, 1,3-propanediol, 1,4-butanediol, neopentyl glycol, 1,6-hexanediol, diethylene glycol, triethylene glycol, tetraethylene glycol, dipropylene glycol, and polypropylene glycols; and trihydric and higher alcohols such as glycerol, diglycerol, erythritol, trimethylolethane, trimethylolpropane, pentaerythritol, dipentaerythritol, and sorbitol. The alcohol may also be any of polyether polyols, polyester polyols, polycarbonate polyols, and polyolefin polyols. The alcohol is preferably an aliphatic alcohol having 1 to 10 carbon atoms, of which trimethylolpropane or another aliphatic polyhydric alcohol is more preferred.

The epoxy resin compositions may each contain alicyclic epoxy compound(s) as the component (A) in an amount of preferably 95 to 50 parts by weight, more preferably 90 to 55 parts by weight, and furthermore preferably 80 to 60 parts by weight, per 100 parts by weight of the total amount of the component (A) and the component (B) mentioned later. An epoxy resin composition containing the alicyclic epoxy compound(s) in an amount of more than 95 parts by weight may not enjoy the effects of the component (B). In contrast, an epoxy resin composition containing the alicyclic epoxy compound(s) in an amount of less than 50 parts by weight may be liable to deteriorate in thermal stability and transparency, although having an improved flexural strength.

Of alicyclic epoxy compounds for use as the component (A), low-viscosity compounds, such as low-viscosity cycloalkylene glycol diglycidyl ethers having a viscosity of 500 mPa·s or less at 25° C., can also serve as a reactive diluent when used in combination with another component (A). Such cycloalkylene glycol diglycidyl ethers are typified by cyclohexanedimethanol diglycidyl ethers, cyclohexanediol diglycidyl ethers, and hydrogenated bisphenol-A epoxy resins.

Exemplary reactive diluents other than the component (A) usable herein include glycidyl epoxy resins having an aromatic ring, such as liquid bisphenol-A and liquid bisphenol-F epoxy resins; and glycidylamine epoxy resins. A reactive diluent other than the component (A), when employed, may be used in an amount of 20 parts by weight or less, and preferably 15 parts by weight or less, per 100 parts by weight of the component (A) alicyclic epoxy compound(s). The presence of the reactive diluent in an amount of more than 20 parts by weight may prevent an epoxy resin composition from exhibiting desired performance.

Alicyclic epoxy compounds for use as the component (A) herein are preferably liquid for better workability upon blending and casting. However, even an epoxy compound which is solid as a single substance is usable herein, as long as the resulting thermosetting epoxy resin composition after blending of the respective components has a viscosity of typically 20000 mPa·s or less at 25° C., as described above. The same is true for other epoxy compounds than the component (A). Exemplary solid epoxy compounds usable herein include solid bisphenol epoxy compounds, novolak epoxy compounds, glycidyl esters, triglycidyl isocyanurate, and EHPE-3150 [epoxidized cyclohexane polyether supplied by Daicel Chemical Industries Ltd.]. Each of such solid epoxy compounds may be used alone or in combination. The solid epoxy compound(s) may be used in such an amount that the thermosetting epoxy resin composition has a viscosity typically of not more than 20000 mPa·s at 25° C.

[Polyester Polyol and/or Polycarbonate Polyol (B)]

Next, the component (B) for use in the present invention will be illustrated. The component (B) for use herein is a polyester polyol and/or a polycarbonate polyol, each polyol having two or more terminal hydroxyl groups per molecule. The hydroxyl groups may be any of alcoholic hydroxyl groups and phenolic hydroxyl groups. The component (B) is not limited, as long as forming a liquid thermosetting epoxy resin composition after compounded with other components such as the component (A), but the component (B) itself is preferably liquid. The polyester polyol or polycarbonate polyol has a number-average molecular weight of preferably 200 to 10000, more preferably 300 to 5000, and furthermore preferably 400 to 4000. The polyester polyol or polycarbonate polyol, if having a molecular weight of less than 200, may not sufficiently effectively allow the epoxy resin compositions to have a lower elastic modulus and a higher flexural strength. In contrast, the polyester polyol or polycarbonate polyol, if having a molecular weight of more than 10000, may become nonliquid at room temperature (25° C.). The epoxy resin compositions may contain the polyester polyol and/or polycarbonate polyol in an amount (in a total amount) of preferably 5 to 50 parts by weight, more preferably 10 to 45 parts by weight, and furthermore preferably 20 to 40 parts by weight, based on 100 parts by weight of the total amount of the component (A) and the component (B). An epoxy resin composition containing the component (B) in an amount of more than 50 parts by weight may deteriorate in thermal stability and/or transparency, although having a higher flexural strength. In contrast, an epoxy resin composition containing the component (B) in an amount of less than 5 parts by weight may not sufficiently enjoy advantageous effects of the component (B).

The polyester polyol and/or polycarbonate polyol (B) for use herein may include any of linear polyols and branched chain polyols. Typically, the polyester polyol and/or polycarbonate polyol (B) may include two or more different linear polyols or two or more different branched chain polyols, or may include both a linear polyol and a branched chain polyol.

The component (B) for use herein, when being a polyester polyol having an ester skeleton in the molecule, may be synthetically prepared typically by a regular procedure of a method for manufacturing polyester polyols, such as transesterification, or ring-opening polymerization of a lactone. Exemplary polyols for use in the synthetic preparation of the polyester polyol include ethylene glycol, diethylene glycol, 1,3-propanediol, 1,4-butanediol, 1,3-butanediol, 2,3-butanediol, 1,5-pentanediol, 3-methyl-1,5-pentanediol, 1,6-hexanediol, 2,6-hexanediol, 1,4-cyclohexanedimethanol, 1,12-dodecanediol, polybutadienediols, neopentyl glycol, tetramethylene glycol, propylene glycol, dipropylene glycol, glycerol, trimethylolpropane, 1,3-dihydroxyacetone, hexylene glycol, 1,2,6-hexanetriol, ditrimethylolpropane, and pentaerythritol. Exemplary carboxylic acids for use in the synthetic preparation of the polyester polyol include oxalic acid, adipic acid, sebacic acid, fumaric acid, malonic acid, succinic acid, glutaric acid, azelaic acid, citric acid, 2,6-naphthalenedicarboxylic acid, phthalic acid, isophthalic acid, terephthalic acid, citraconic acid, 1,10-decanedicarboxylic acid, methylhexahydrophthalic anhydride, hexahydrophthalic anhydride, methyltetrahydrophthalic anhydride, tetrahydrophthalic anhydride, pyromellitic anhydride, trimellitic anhydride, lactic acid, malic acid, glycolic acid, dimethylolpropionic acid, and dimethylolbutanoic acid. Exemplary lactones for use in the lactone ring-opening polymerization include ε-caprolactone, δ-valerolactone, and γ-butyrolactone.

Exemplary commercial products of such polyester polyols include PLACCEL 205U, L205AL, L208AL, L212AL, L220AL, L230AL, 220ED, 220EC, 220EB, 303, 305, 308, 312, L312AL, 320, L320AL, 410, 410D, P3403, E227, DC2009, DC2016, and DC2209 each supplied by Daicel Chemical Industries Ltd.

The component (B) for use herein, when being a polycarbonate polyol having a carbonate skeleton, may be synthetically prepared according to a customary procedure of a method for producing polycarbonate polyols, such as a phosgene process or a carbonate interchange reaction using a dialkyl carbonate (e.g., dimethyl carbonate or diethyl carbonate) or diphenyl carbonate (e.g., JP-A No. S62-187725, JP-A No. H02-175721, JP-A No. H02-49025, JP-A No. H03-220233, and JP-A No. H03-252420). A cured resin article derived from a polycarbonate polyol exhibits superior stability even in a hot and humid environment because the carbonate bond is resistant to thermal decomposition.

Exemplary polyols for use in combination with a dialkyl carbonate in the carbonate interchange reaction include 1,6-hexanediol, ethylene glycol, diethylene glycol, 1,3-propanediol, 1,4-butanediol, 1,3-butanediol, 2,3-butanediol, 1,5-pentanediol, 3-methyl-1,5-pentanediol, 1,4-cyclohexanedimethanol, 1,12-dodecanediol, butadienediols, neopentyl glycol, tetramethylene glycol, propylene glycol, and dipropylene glycol.

The polycarbonate polyol as the component (B) may have a number-average molecular weight of preferably 200 to 10000, more preferably 300 to 5000, and furthermore preferably 400 to 4000. A polycarbonate polyol having a number-average molecular weight of less than 200 may not so effectively contribute to lower elastic modulus and higher flexural strength; and, if having a number-average molecular weight of more than 10000, may be nonliquid at room temperature (25° C.)

Exemplary commercial products of such polycarbonate polyols include PLACCEL CD 205, CD 210, CD 220, CD 205PL, CD 205HL, CD 210PL, CD 210HL, CD 220PL, CD 220HL, CD 220EC, and CD 221T [each supplied by Daicel Chemical Industries Ltd.]; ETERNACOLL UH-CARB50, UH-CARB100, UH-CARB300, UH-CARB90 (1/3), UH-CARB90 (1/1), and UH-CARB100 [each supplied by Ube Industries, Ltd.]; and DURANOL T6002, T5652, T4672, T4692, and G3452 [each supplied by Asahi Kasei Chemicals Corporation].

The epoxy resin compositions may each contain the polycarbonate polyol as the component (B) in an amount of preferably 5 to 50 parts by weight, more preferably 10 to 45 parts by weight, and furthermore preferably 20 to 40 parts by weight, per 100 parts by weight of the total amount of the component (A) and the component (B). An epoxy resin composition containing the component (B) in an amount of more than 50 parts by weight may have insufficient transparency although having higher flexural strength. In contrast, an epoxy resin composition containing the component (B) in an amount of less than 5 parts by weight may not sufficiently enjoy the advantageous effects of the component (B).

[Phosphorous Ester (C)]

Next, the phosphorous ester serving as the component (C) in the present invention will be illustrated. The phosphorous ester compound (C) for use herein is not limited, as long as being a compound having at least one phosphorus atom per molecule.

Preferred examples of the phosphorous ester compound (C) include 9,10-dihydro-9-oxa-10-phosphaphenanthrene 10-oxide, bis(2,6-di-t-butyl-4-methylphenyl)pentaerythritol di-phosphite, bis(2,4-di-t-butylphenyl)pentaerythritol di-phosphite, tris(2,4-di-t-butylphenyl)phosphite, tris(mono- or di-nonylphenyl)phosphite, tris(2-ethylhexyl)phosphite, triphenyl phosphite, tris(monononylphenyl)phosphite, and trisisodecyl phosphite.

The epoxy resin compositions may each contain the phosphorous ester compound (C) in an amount of preferably 0.005 to 5 parts by weight, more preferably 0.01 to 1 part by weight, and furthermore preferably 0.05 to 0.5 part by weight, per 100 parts by weight of the total amount of the component (A) and the component (B). An epoxy resin composition containing the phosphorous ester compound (C) in an amount of more than 5 parts by weight may have insufficient resistance to hydrolysis; and an epoxy resin composition containing the phosphorous ester compound (C) in an amount of less than 0.005 part by weight may suffer from insufficient viscosity stability of the base resin.

Such phosphorous esters may be available as JP-360 and JP-308E [each from Johoku Chemical Co., Ltd.]; IRGAFOS 168 [from Ciba Specialty Chemicals Corporation]; Sanko Epoclean [from SANKO CO., LTD.]; and ADEKA STAB 3010 and ADEKA STAB PEP-36 [each from ADEKA CORPORATION].

[Curing Agent (D)]

Next, the curing agent for use as the component (D) in the present invention will be illustrated. The curing agent (D) for use herein may be an acid anhydride. The acid anhydride herein may be arbitrarily selected from among those commonly used as curing agents for epoxy resins. The acid anhydride is preferably one which is liquid at room temperature, such as methyltetrahydrophthalic anhydride, methylhexahydrophthalic anhydride, dodecenylsuccinic anhydride, and methyl-endomethylene-tetrahydrophthalic anhydride. In addition or alternatively, an acid anhydride that is solid at room temperature may be employed within a range not adversely affecting impregnation properties of the epoxy resin compositions according to the present invention. Such solid acid anhydride is exemplified by phthalic anhydride, tetrahydrophthalic anhydride, hexahydrophthalic anhydride, and methylcyclohexenedicarboxylic anhydride. Such an acid anhydride being solid at room temperature, when employed, is preferably used as a mixture being liquid at room temperature, the mixture being prepared by dissolving the solid acid anhydride in an acid anhydride being liquid at room temperature.

The epoxy resin compositions may each contain the curing agent in an amount of preferably 50 to 150 parts by weight, more preferably 52 to 145 parts by weight, and furthermore preferably 55 to 140 parts by weight, per 100 parts by weight of the total amount of the component (A) and the component (B) of the base resin. More specifically, the epoxy resin compositions preferably contain the curing agent in such an amount effective to exhibit effects as a curing agent, namely, in such an amount as to give an acid anhydride equivalent of 0.5 to 1.5 per one equivalent of epoxy group in the alicyclic epoxy compound(s) as the component (A) and other epoxy compounds optionally added.

[Curing Accelerator (E)]

Next, the curing accelerator for use as the component (E) in the present invention will be illustrated. The curing accelerator serving as the component (E) herein is not limited, as long as being one generally used, but is preferably a diazabicycloundecene curing accelerator or a phosphorus curing accelerator. This may be used alone or in combination as a mixture with one or more other curing accelerators for epoxy resins, such as tertiary or quaternary amines, in an amount of up to 50 percent by weight. The diazabicycloundecene or phosphorus curing accelerator preferably constitutes at least 50 percent by weight of the total amount of curing accelerators. The diazabicycloundecene or phosphorus curing accelerator, if constituting less than 50 percent by weight of curing accelerators, may cause the cured article to have a deteriorated hue. The diazabicycloundecene or phosphorus curing accelerator preferably constitutes 70 percent by weight or more of curing accelerators for maintaining a further better hue of the cured article.

The diazabicycloundecene curing accelerator is typified by 1,8-diazabicyclo[5.4.0]undecene-7 (DBU) and salts thereof, of which preferred are octanoic acid salt and sulfonic acid salt of 1,8-diazabicyclo[5.4.0]undecene-7, and PX-4ET (supplied by Nippon Chemical Industrial Co., Ltd.). As the curing accelerator, the diazabicycloundecene curing accelerator may be used alone or in combination as a mixture with one or more other curing accelerators for epoxy resins, such as commonly used tertiary amine curing accelerators or phosphorus curing accelerators such as triphenylphosphine in an amount of up to 50 percent by weight.

The epoxy resin compositions may each contain curing accelerator(s) as the component (E) in an amount of preferably 0.05 to 5 parts by weight, more preferably 0.1 to 3 parts by weight, furthermore preferably 0.2 to 3 parts by weight, and most preferably 0.25 to 2.5 parts by weight, per 100 parts by weight of the total amount of the component (A) and the component (B) of the base resin. An epoxy resin composition containing the curing accelerator (E) in an amount of less than 0.05 part by weight may not sufficiently enjoy curing acceleration effects of the curing accelerator (E). In contrast, an epoxy resin composition containing the curing accelerator (E) in an amount of more than 5 parts by weight may give a cured article with a deteriorated hue. The curing accelerator as the component (E) is a compound having the function of accelerating a curing reaction upon curing of epoxy compound(s) by the action of the acid anhydride.

Examples of other curing accelerators usable as the component (E) herein include known compounds including tertiary amines such as benzyldimethylamine and 2,4,6-tris(dimethylaminomethyl)phenol; imidazoles such as 2-ethyl-4-methylimidazole and 1-cyanoethyl-2-ethyl-4-methylimidazole; organic phosphine compounds such as triphenylphosphine; tertiary amine salts; quaternary ammonium salts; phosphonium salts; and metal salts such as tin octanoate and zinc octanoate.

[Curing Catalyst (D')]

Next, the curing catalyst for use as the component (D') in the present invention will be illustrated. The curing catalyst (D') for use herein may be a cationic-polymerization initiator. The cationic-polymerization initiator is an initiator that releases, through heating, a substance initiating cationic polymerization. The epoxy resin compositions may each contain the curing catalyst (D') in an amount of preferably 0.01 to 15 parts by weight, more preferably 0.05 to 12 parts by weight, and furthermore preferably 0.1 to 10 parts by weight, per 100 parts by weight of the total amount of the component (A) and the component (B) of the base resin. An epoxy resin composition containing the curing catalyst (D') in an amount within this range can give a cured article which is satisfactory in properties such as thermal stability, transparency, and weatherability. The cationic-polymerization initiator is typified by aryldiazonium salts [e.g., PP-33 supplied by ADEKA CORPORATION]; aryliodonium salts; arylsulfonium salts [e.g., FC-509 supplied by 3M Company]; UVE1014 [supplied by General Electric Company]; CP-66 and CP-77 [each supplied by ADEKA CORPORATION]; and SI-60L, SI-80L, SI-100L, and SI-110L [each supplied by Sanshin Chemical Industry Co., Ltd.].

In addition or alternatively, a combination of a silanol or a phenol with a chelate compound between a metal (e.g., aluminum or titanium) and an acetoacetic ester or a diketone may also be used as the curing catalyst (D'). The chelate compound is typified by tris(acetylacetonato)aluminum and tris(ethyl acetoacetato)aluminum. The silanol or phenol is exemplified by triphenylsilanol and bisphenol-S.

[Additives]

Where necessary, the liquid thermosetting epoxy resin compositions according to the present invention may further include a low-molecular-weight compound having one or more hydroxyl groups so as to proceed the reaction mildly. The compound having one or more hydroxyl groups is typified by ethylene glycol, diethylene glycol, and glycerol. It should be noted that this additive is a low-molecular-weight substance and is distinguished from the polyester polyol and/or polycarbonate polyol in the present invention.

In addition, the liquid thermosetting epoxy resin compositions according to the present invention may further include various additives within ranges not adversely affecting the properties such as viscosity and transparency. Such additives are typified by silicone- or fluorine-containing antifoaming agents; silane coupling agents such as γ-glycidoxypropyltrimethoxysilane; fillers; antioxidants; flame retardants; and colorants. Each category of these additives may be contained in an amount of 5 percent by weight or less based on the total amount of the resin composition.

The liquid thermosetting epoxy resin compositions according to the present invention have a high glass transition temperature and high transparency, have a low water absorption, and are thereby advantageously usable for the sealing typically of optical semiconductors, for the bonding of electronic components, and as sheets and sealers for liquid crystal panels. Of these uses, the liquid thermosetting epoxy resin compositions are particularly advantageously suitable as resin compositions for sealing an optical semiconductor.

The liquid thermosetting epoxy resin compositions according to the present invention may be cured by the action of heat to yield cured resin articles. If the curing is performed with an active energy ray such as an ultraviolet ray, the resulting cured article, particularly when being a thick article, may suffer from a difference in degree of curing between its surface layer and inner layer, and thereby suffer from troubles such as "wrinkles," resulting in lower productivity.

[Cured Resin Articles]

Cured resin articles according to embodiments of the present invention are obtained by curing the liquid thermosetting epoxy resin compositions or liquid epoxy resin compositions according to the present invention. The cured resin articles according to the present invention include a moiety derived from the alicyclic epoxy compound (A) having at least one alicyclic skeleton and two or more epoxy groups per molecule and a moiety derived from the polyester polyol and/or polycarbonate polyol (B), each polyol having two or more terminal hydroxyl groups.

The cured resin articles according to the present invention each have a glass transition temperature of preferably 110° C. to 195° C. and more preferably 120° C. to 185° C.

The cured resin articles according to the present invention each have a flexural modulus of preferably 1700 to 2800 MPa and more preferably 1800 to 2750 MPa. The cured resin articles each have a flexural strength of preferably 50 MPa or more (e.g., 50 to 100 MPa) and more preferably 60 to 95 MPa. A cured article having a flexural strength of less than 50 MPa may be liable to deform even with a small stress to cause an element sealed therewith to break in the manufacturing process or use process of the cured resin article.

The cured resin articles according to the present invention are preferably optically homogeneous. As used herein the term "optically homogeneous" typically means that a cured resin article has a refractive index being uniform within the article, and this state may be judged typically by a high transmittance to light or by light scattering. Such optical homogeneity may be achieved by allowing a cured resin article to have a degree of curing being uniform within the cured article.

The cured resin articles according to the present invention each have a transmittance to light at a wavelength of 380 nm of preferably 70 T % or more and more preferably 75 T % or more. The cured resin articles according to the present invention each have a transmittance to light at a wavelength of 400 nm of preferably 78 T % or more and more preferably 81 T % or more. A cured article having a transmittance lower than the above-specified ranges may cause an optical semiconductor element, when sealed with the cured article, to have a lower light emission efficiency and lower performance.

The cured resin articles according to the present invention each have a water absorption of preferably 0.1% to 0.8% and more preferably 0.2% to 0.7%. A cured article having a water absorption of more than 0.8% may suffer from package cracking during packaging process of semiconductors into a package.

[Optical Semiconductor Devices]

Optical semiconductor devices according to embodiments of the present invention include an optical semiconductor element sealed with any of the optical-semiconductor-sealing liquid thermosetting epoxy resin compositions and optical-semiconductor-sealing liquid epoxy resin compositions according to the present invention.

According to the present invention, the base resin is preferably used in combination with a curing agent and a curing accelerator or with a curing catalyst to yield excellent liquid thermosetting epoxy resin compositions. However, the base resin (a mixture of the components (A), (B), and (C)) for use herein can be used alone as a liquid epoxy resin composition. The liquid epoxy resin composition in this case is advantageously used typically as or for a thermosetting resin composition or an active-energy-ray-curable resin composition.

The liquid thermosetting epoxy resin compositions according to the present invention may be produced according to known processes. Typically, a liquid thermosetting epoxy resin composition may be prepared by blending predetermined amounts of the components (A), (B), and (C) as the base resin, or the components (A), (B), (C), (D), and (E), or the components (A), (B), (C), and (D'), with optional additives and other components, and stirring and mixing them preferably with heating in vacuo and debubbling. The stirring and mixing is generally preferably performed at a preset temperature of 10° C. to 150° C. Stirring and mixing performed at a present temperature of lower than 10° C. may disadvantageously cause such an excessively high viscosity of the composition as to impede homogeneous stirring and mixing. In contrast, stirring and mixing performed at a present temperature of higher than 150° C. may disadvantageously cause a curing reaction during preparation to fail to give a normal liquid thermosetting epoxy resin composition. The liquid thermosetting epoxy resin compositions may also be prepared by stirring and mixing the materials typically for 10 minutes using a general-purpose apparatus such as single-screw or multi-screw extruder, kneader, or dissolver each having a pressure reduction unit.

The prepared liquid thermosetting epoxy resin compositions may be poured into a predetermined forming die, heated and cured therein under predetermined conditions so as to perform, for example, sealing of an optical semiconductor. The liquid thermosetting epoxy resin compositions according to the present invention may be cured at a temperature of 100° C. to 200° C., preferably 100° C. to 190° C., and furthermore preferably 100° C. to 180° C., for a curing time of 30 to 600 minutes, preferably 45 to 540 minutes, and furthermore preferably 60 to 480 minutes. Curing performed at a temperature for a time each lower than (shorter than) the lower limits of the above-specified ranges may disadvantageously insufficiently proceed. In contrast, curing performed at a temperature for a time each higher than (longer than) the upper limits of the above-specified ranges may disadvantageously cause decomposition of the resin components. While the curing conditions may vary depending on various factors, they may be suitably and, for example, the curing time may be set short when the curing temperature is high, and the curing time may be set long when the curing temperature is low.

EXAMPLES

The present invention will be illustrated in further detail with reference to several examples below, which by no means limit the scope of the present invention. Properties of cured articles prepared from liquid thermosetting epoxy resin compositions according to the examples and comparative examples were measured by the following methods.

[Viscosity Stability]

Viscosities of samples after leaving left at 80° C. for 3 days were measured. The viscosity measurement was performed with an E-type viscometer [TVE-22H supplied by Toki Sangyo Co., Ltd.] (25° C.).

[Thermal Stability]

The thermosetting epoxy resin compositions obtained according to the examples and comparative examples were cured by heating at 110° C. for 2 hours and subsequently at 180° C. for 2 hours to give test pieces 10 mm long, 5 mm wide, and 5 mm thick. For Examples 7 and 8 and Comparative Example 2, heating was performed at 100° C. for 1 hours and subsequently at 160° C. for 3 hours. The glass transition temperatures (Tg, ° C.) of the test pieces were measured using a thermomechanical analyzer (TMA) (supplied by Seiko Instruments Inc.). The measured glass transition temperatures were used as indices of thermal stability of the samples.

[Transparency]

Cured resin articles each 3 mm thick were prepared as test pieces by heating and curing the epoxy resin compositions under the same conditions as in the thermal stability test. Light transmittances (T %) of the test pieces to light at wavelengths of 400 nm and 380 nm were determined using a spectrophotometer [UV-2450, supplied by Shimadzu Corporation]. The measured transmittances were used as indices of transparency.

[Flexural Strength Tests (Flexural Modulus and Flexural Strength)]

Flexural strength test pieces were prepared by preparing cured articles under the same conditions as in the thermal stability test pieces and processing the cured articles into dimensions of 5 mm by 10 mm by 80 mm. The flexural strength tests were carried out in accordance with Japanese Industrial Standard (JIS) K 6911 at a bending speed of 1 mm/minute.

[Water Absorption Test]

Cured resin articles as test pieces were prepared in the same manner as above. The test pieces were left in water at 23° C. for 24 hours, and the percentages of water absorption of the test pieces were determined from a difference in weight between before and after the test, in accordance with JIS K 6991.

Example 1

Materials used as a base resin were 80 parts by weight of 3,4-epoxycyclohexylmethyl(3,4-epoxy)cyclohexanecarboxylate (trade name "CELLOXIDE 2021P" supplied by Daicel Chemical Industries Ltd., alicyclic epoxy resin, liquid (25° C.), having an epoxy equivalent of 134) as a component (A); 20 parts by weight of a polycaprolactonetriol (trade name "PLACCEL 305" supplied by Daicel Chemical Industries Ltd., liquid (25° C.), having a number-average molecular weight of 550) as a component (B); and 0.5 part by weight of 9,10-dihydro-9-oxa-10-phosphaphenanthrene 10-oxide (trade name "Sanko Epoclean" supplied by SANKO CO., LTD.) as a component (C). In addition, 0.5 part by weight of an aromatic sulfonium salt cationic-polymerization initiator (trade name "San-Aid SI-100L" supplied by Sanshin Chemical Industry Co., Ltd.) was used as a component (D').

These materials were blended by mixing and stirring them at room temperature for 20 minutes using "AWATORIREN-TARO (Thinky Mixer)" supplied by THINKY CORPORATION and yielded a liquid thermosetting epoxy resin composition.

The resulting liquid thermosetting epoxy resin composition was thermally cured under the aforementioned conditions to give a cured resin article, and the properties thereof were measured. As a result, the cured resin article was found to have a glass transition temperature of 153° C., a light transmittance (400 nm) of 80.5 T %, a light transmittance (380 nm) of 70.2 T %, a flexural modulus of 2440 MPa, a flexural strength of 106 MPa, and a water absorption of 0.39% and to have excellent properties such as thermal stability, transparency, and bending properties. The base resin used in this example was found to have a viscosity after the viscosity stability test of 432 mPa·s, while the base resin immediately after blending had a viscosity of 410 mPa·s.

Example 2

Materials used as a base resin were 80 parts by weight of 3,4-epoxycyclohexylmethyl(3,4-epoxy)cyclohexanecarboxylate (trade name "CELLOXIDE 2021P" supplied by Daicel Chemical Industries Ltd., alicyclic epoxy resin, liquid (25° C.), having an epoxy equivalent of 134) as a component (A); 20 parts by weight of a polycarbonate diol using 1,6-hexanediol as one of polyol components (trade name "PLACCEL CD205PL" supplied by Daicel Chemical Industries Ltd., liquid (25° C.), having a number-average molecular weight of 500) as a component (B); and 0.5 part by weight of 9,10-dihydro-9-oxa-10-phosphaphenanthrene 10-oxide (supplied by SANKO CO., LTD., trade name "Sanko Epoclean") as a component (C). In addition, there were used 103.4 parts by weight of methylhexahydrophthalic anhydride (trade name "Rikacid MH-700" supplied by New Japan Chemical Co., Ltd.) as a component (D); and 0.5 part by weight of octanoic acid salt of 1,8-diazabicyclo[5.4.0]undecene-7 (trade name "U-CAT SA-102" supplied by San-Apro Ltd.) as a component (E); and 1.1 parts by weight of ethylene glycol (supplied by Wako Pure Chemical Industries, Ltd.).

These materials were blended by mixing and stirring them at room temperature for 20 minutes using "AWATORIREN-TARO (Thinky Mixer)" supplied by THINKY CORPORATION and thereby yielded a liquid thermosetting epoxy resin composition.

The resulting liquid thermosetting epoxy resin composition was thermally cured under the aforementioned conditions to give a cured resin article, and the properties thereof were measured. As a result, the cured resin article was found to have a glass transition temperature of 173° C., a light transmittance (400 nm) of 85.7 T %, a light transmittance (380 nm) of 81.2 T %, a flexural modulus of 2705 MPa, a flexural strength of 101 MPa, and a water absorption of 0.38% and to have excellent properties such as thermal stability, transparency, and bending properties. The base resin used in this example was found to have a viscosity after the viscosity stability test of 370 mPa·s, while the base resin immediately after blending had a viscosity of 298 mPa·s.

Example 3

The materials used in Example 2 were used herein, except for using, as a component (B), a polycarbonate diol (trade name "PLACCEL CD210PL" supplied by Daicel Chemical Industries Ltd., liquid (25° C.), having a number-average molecular weight of 1000) using 1,6-hexanediol as one of polyol components; using the component (A) in an amount of 70 parts by weight, the component (B) in an amount of 30 parts by weight, the component (D) in an amount of 87.6 parts by weight, and the component (E) in an amount of 0.45 part by weight; using, as a component (C), 0.5 part by weight of bis(2,6-di-t-butyl-4-methylphenyl)pentaerythritol-di-phosphite (trade name "ADEKA STAB PEP-36" supplied by ADEKA CORPORATION); and not using ethylene glycol. These materials were blended by the procedure of Example 1 and thereby yielded a liquid thermosetting epoxy resin composition.

The resulting liquid thermosetting epoxy resin composition was thermally cured under the aforementioned conditions to give a cured resin article, and the properties thereof were measured. As a result, the cured resin article was found to have a glass transition temperature of 181° C., a light transmittance (400 nm) of 81.4 T %, a light transmittance (380 nm) of 74.4 T %, a flexural modulus of 2505 MPa, a flexural strength of 111 MPa, and a water absorption of 0.41% and to have excellent properties such as thermal stability, transparency, and bending properties. The base resin used in this example was found to have a viscosity after the viscosity stability test of 865 mPa·s, while the base resin immediately after blending had a viscosity of 850 mPa·s.

Example 4

Materials used as a base resin were 80 parts by weight of 3,4-epoxycyclohexylmethyl(3,4-epoxy)cyclohexanecarboxylate (trade name "CELLOXIDE 2021P" supplied by Daicel Chemical Industries Ltd.) as a component (A); 20 parts by weight of a polycarbonate diol (trade name "PLACCEL CD220PL" supplied by Daicel Chemical Industries Ltd.) as a component (B); and 0.5 part by weight of bis(2,6-di-t-butyl-4-methylphenyl)pentaerythritol-di-phosphite (trade name "ADEKA STAB PEP-36" supplied by ADEKA CORPORATION) as a component (C). In addition, 0.5 part by weight of an aromatic sulfonium salt cationic-polymerization initiator (trade name "San-Aid SI-100L" supplied by Sanshin Chemical Industry Co., Ltd.) was used as a component (D').

These materials were blended by mixing them with stirring at room temperature for 20 minutes using "AWATORIREN-TARO (Thinky Mixer)" supplied by THINKY CORPORATION and yielded a liquid thermosetting epoxy resin composition.

The resulting liquid thermosetting epoxy resin composition was thermally cured under the aforementioned conditions to give a cured resin article, and the properties thereof were measured. As a result, the cured resin article was found to have a glass transition temperature of 148° C., a light transmittance (400 nm) of 81.1 T %, a light transmittance (380 nm) of 78.9 T %, a flexural modulus of 2310 MPa, a flexural strength of 109 MPa, and a water absorption of 0.40% and to have excellent properties such as thermal stability, transparency, and bending properties. The base resin used in this example was found to have a viscosity after the viscosity stability test of 1,070 mPa·s, while the base resin immediately after blending had a viscosity of 1,040 mPa·s.

Comparative Example 1

A material used as a base resin was 100 parts by weight of 3,4-epoxycyclohexylmethyl(3,4-epoxy)cyclohexanecarboxylate (trade name "CELLOXIDE 2021P" supplied by Daicel Chemical Industries Ltd.) as a component (A), without using a component (B). In addition, there were used 129 parts by weight of methylhexahydrophthalic anhydride (trade name "Rikacid MH-700" supplied by New Japan Chemical Co., Ltd.) as a component (D); 0.65 part by weight of octanoic acid salt of 1,8-diazabicyclo[5.4.0]undecene-7 (trade name "U-CAT SA-102" supplied by San-Apro Ltd.) as a component (E); and 0.65 part by weight of ethylene glycol (supplied by Wako Pure Chemical Industries, Ltd.).

These materials were blended by the procedure of Example 1 by stirring and mixing them at room temperature for 20 minutes using "AWATORIRENTARO (Thinky Mixer)" supplied by THINKY CORPORATION and yielded a liquid thermosetting epoxy resin composition.

The resulting liquid thermosetting epoxy resin composition was thermally cured under the aforementioned conditions to give a cured resin article, and the properties thereof were measured. As a result, the cured resin article was found to have a glass transition temperature of 198° C., a light transmittance (400 nm) of 86.5 T %, a light transmittance (380 nm) of 81.4 T %, a flexural modulus of 3020 MPa, a flexural strength of 56.3 MPa, and a water absorption of 0.60% and to have an excessively high flexural modulus and a low flexural strength.

Comparative Example 2

Materials were blended by the procedure of Example 1, except for not using 9,10-dihydro-9-oxa-10-phosphaphenanthrene 10-oxide (trade name "Sanko Epoclean" supplied by SANKO CO., LTD.) as the component (C), and yielded a liquid thermosetting epoxy resin composition.

The resulting liquid thermosetting epoxy resin composition was thermally cured under the aforementioned conditions to give a cured resin article, and the properties thereof were measured. As a result, the cured resin article was found to have a glass transition temperature of 149° C., a light transmittance (400 nm) of 80.5 T %, a light transmittance (380 nm) of 72.8 T %, a flexural modulus of 2420 MPa, a flexural strength of 104 MPa, and a water absorption of 0.38% and to have excellent properties such as thermal stability, transparency, and bending properties. However, the base resin used in this comparative example was found to have a viscosity after the viscosity stability test of 5620 mPa·s, while the base resin immediately after blending had a viscosity of 408 mPa·s.

Comparative Example 3

Materials were blended by the procedure of Example 3, except for not using bis(2,6-di-t-butyl-4-methylphenyl)pentaerythritol-di-phosphite (trade name "ADEKA STAB PEP-36" supplied by ADEKA CORPORATION) as the component (C), and yielded a liquid thermosetting epoxy resin composition.

The resulting liquid thermosetting epoxy resin composition was thermally cured under the aforementioned conditions to give a cured resin article, and the properties thereof were measured. As a result, the cured resin article was found to have a glass transition temperature of 147.2° C., a light transmittance (400 nm) of 84.6 T %, a light transmittance (380 nm) of 80.9 T %, a flexural modulus of 2360 MPa, a flexural strength of 109 MPa, and a water absorption of 0.63% and to have excellent properties such as thermal stability, transparency, and bending properties. However, the base resin used in this comparative example was found to have a viscosity after the viscosity stability test of 12,480 mPa·s, while the base resin immediately after blending had a viscosity of 990 mPa·s.

As has been described above, cured articles prepared from resin compositions as blends of the respective components (A), (B), and (C) as a base resin, or the components (A), (B), (C), (D), and (E), or the components (A), (B), (C), and (D') can each have a lower elastic modulus and a higher flexural strength without suffering from reduction in transparency (light transmittance).

INDUSTRIAL APPLICABILITY

Liquid thermosetting epoxy resin compositions according to embodiments of the present invention give cured articles which are free from occurrence of insufficiently cured portions, are optically homogeneous, and have satisfactory transparency. They also have a high glass transition temperature, exhibit superior thermal stability, have a low flexural modulus and a high flexural strength, and do not suffer from disadvantages in heat-cycle endurance. In addition, the epoxy resin compositions employ base resins having excellent storage stability and are thereby easy to handle. They are therefore usable typically for the sealing of optical semiconductor and for the bonding of electronic components.

The invention claimed is:

1. A liquid thermosetting epoxy resin composition comprising
    a base resin comprising 95 to 50 parts by weight of an alicyclic epoxy compound (A) having at least one alicyclic skeleton and two or more epoxy groups per molecule; 5 to 50 parts by weight of a polyester polyol and/or a polycarbonate polyol (B), each polyol having two or more terminal hydroxyl groups; and 0.005 to 5 parts by weight of a phosphorous ester (C), each per 100 parts by weight of the total amount of the component (A) and the component (B);
    50 to 150 parts by weight of a curing agent (D) per 100 parts by weight of the total amount of the component (A) and the component (B); and
    0.05 to 5 parts by weight of a curing accelerator (E) per 100 parts by weight of the total amount of the component (A) and the component (B).

2. The liquid thermosetting epoxy resin composition of claim 1, for the sealing of an optical semiconductor.

3. An optical semiconductor device comprising an optical semiconductor element sealed with the epoxy resin composition for the sealing of an optical semiconductor of claim 2.

4. A cured resin article cured from the epoxy resin composition of claim 1.

5. The cured resin article of claim 4, which is optically homogeneous.

6. The liquid thermosetting epoxy resin composition of claim 1, comprising 0.005 to 1 part by weight of the phosphorous ester (C) per 100 parts by weight of the total amount of the component (A) and the component (B).

7. A liquid thermosetting epoxy resin composition comprising
    a base resin comprising 95 to 50 parts by weight of an alicyclic epoxy compound (A) having at least one alicyclic skeleton and two or more epoxy groups per molecule; 5 to 50 parts by weight of a polyester polyol and/or a polycarbonate polyol (B), each polyol having two or more terminal hydroxyl groups; and 0.005 to 5 parts by weight of a phosphorous ester (C), each per 100 parts by weight of the total amount of the component (A) and the component (B); and 0.01 to 15 parts by weight of a curing catalyst (D') per 100 parts by weight of the total amount of the component (A) and the component (B).

8. The liquid thermosetting epoxy resin composition of claim 7, for the sealing of an optical semiconductor.

9. An optical semiconductor device comprising an optical semiconductor element sealed with the epoxy resin composition for the sealing of an optical semiconductor of claim 8.

10. A cured resin article cured from the epoxy resin composition of claim 7.

11. The cured resin article of claim 10, which is optically homogeneous.

12. The liquid thermosetting epoxy resin composition of claim 7, comprising 0.005 to 1 part by weight of the phosphorous ester (C) per 100 parts by weight of the total amount of the component (A) and the component (B).

* * * * *